United States Patent [19]

Cauchy

[11] Patent Number: 5,448,109
[45] Date of Patent: Sep. 5, 1995

[54] THERMOELECTRIC MODULE

[75] Inventor: Charles J. Cauchy, Traverse City, Mich.

[73] Assignee: Tellurex Corporation, Traverse City, Mich.

[21] Appl. No.: 207,838

[22] Filed: Mar. 8, 1994

[51] Int. Cl.$^6$ .................. H01L 23/58; H01L 35/28
[52] U.S. Cl. ........................ 257/719; 257/64; 257/930
[58] Field of Search ............... 257/712, 719, 718, 720, 257/64, 467–469, 930, 51

[56] References Cited

U.S. PATENT DOCUMENTS

| 4,491,679 | 1/1985 | Moore | 136/203 |
|---|---|---|---|
| 4,493,939 | 1/1985 | Blaske et al. | 257/622 |
| 4,717,788 | 1/1988 | Rauch, Sr. et al. | 136/237 |
| 4,717,789 | 1/1988 | Rauch, Sr. et al. | 136/238 |
| 4,764,212 | 8/1988 | Okumura | 75/228 |
| 4,855,810 | 8/1989 | Gelb et al. | 257/930 |
| 5,055,140 | 10/1991 | Kumada et al. | 136/212 |
| 5,108,515 | 4/1992 | Ohta et al. | 136/201 |
| 5,168,339 | 12/1992 | Yokutani et al. | 257/467 |
| 5,246,504 | 9/1993 | Ohta et al. | 134/201 |
| 5,297,438 | 3/1994 | Alles et al. | 73/727 |
| 5,318,743 | 6/1994 | Tokiai et al. | 257/64 |

FOREIGN PATENT DOCUMENTS

| 074618 | 11/1966 | Canada | 257/930 |
|---|---|---|---|
| 1295040 | 5/1969 | Germany | 257/930 |
| 1489287 | 5/1969 | Germany | 257/930 |
| 0178958 | 7/1990 | Japan | 257/930 |
| 1336980 | 3/1972 | United Kingdom | 257/930 |
| 2050437 | 1/1981 | United Kingdom | |
| WO90/16086 | 12/1990 | WIPO | |

OTHER PUBLICATIONS

Bulg. J. Phsy. 6 (1979), 2, pp. 194–200 Studies on the Thermoelectric Characteristics of Cold–Pressed Materials of the Type of . . . .

Experimental Characterization with Single–Band Analysis of Bismuth–Telluride Materials at 300 K, 1985, Society of Automotive Engineers, Inc., pp. 3-57-4-3-579.

Original Papers, Grain Size Effects on Thermoelectrical Properties of Sintered Solid Solutions . . . , Institute of Physics, State Committee for Nuclear Energy, Bucharest, pp. 27–34.

J. Japan Inst. Metals, vol. 53, No. 9 (1989), pp. 958–963.

Original Papers, Grain Size Effect on the Figure of Merit . . . Institute of Physics, State Committee for Nuclear Energy, bucharest, pp. 329–332.

Quantitative Texturanalyse, Fortbildungspraktikum von 2. bis 4. Juli 1992 in Clausthal–Zellerfeld, pp. 544–554.

Electrical Engineering in Japan, vol. 110, No. 4, 1990, pp. 14–23.

M. Imamuddin and A. Dupre: Thermoelectric Properties of Alloys, pp. 415–424.

Journal of Materials Science 27 (1992) 1250–1254 Amin et al.

Primary Examiner—Robert P. Limanek
Assistant Examiner—Alexander O. Williams
Attorney, Agent, or Firm—Flynn, Thiel, Boutell & Tanis

[57] ABSTRACT

A thermoelectric device using a pressed and sintered P-type semiconductor material connected to a crystalline N-type semiconductor material exhibits an unexpectedly high figure-of-merit, Z, and improved mechanical strength.

9 Claims, 1 Drawing Sheet

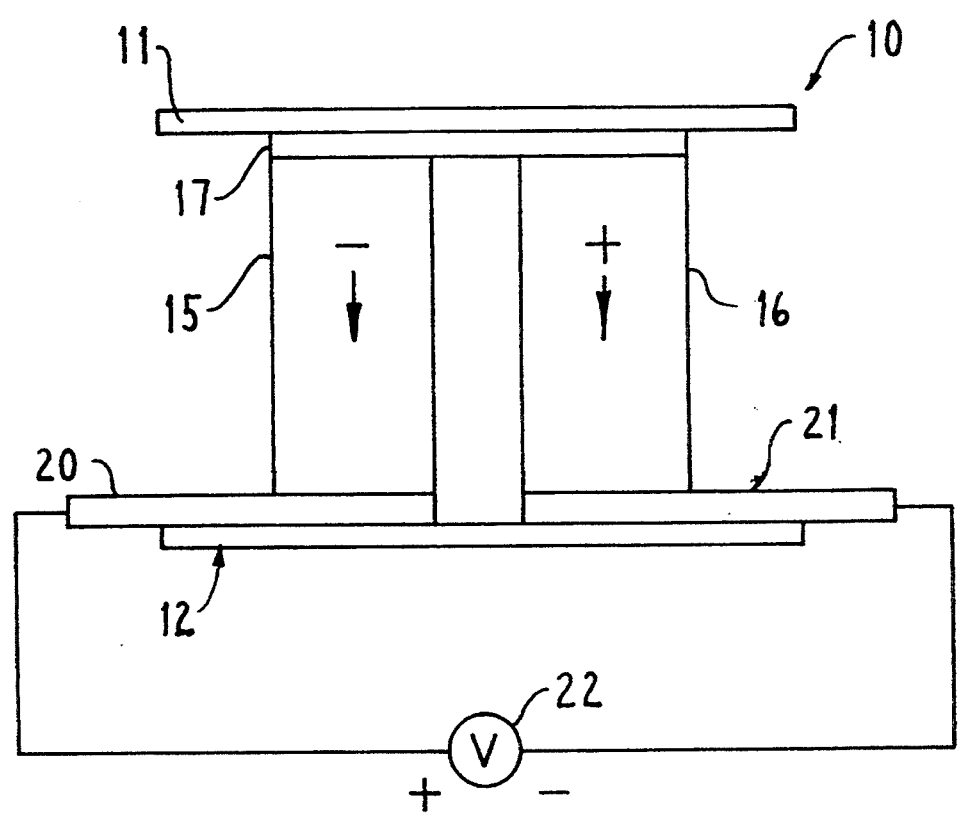

THERMOELECTRIC MODULE

FIELD OF THE INVENTION

The present invention relates generally to a thermoelectric module exhibiting an unexpectedly high efficiency and mechanical strength when used for thermoelectric cooling by the Peltier effect and a method of producing the thermoelectric module.

BACKGROUND OF THE INVENTION

In today's modern society, cooling processes play an important role both in industrial and individual contexts. However, there have recently arisen concerns regarding the use of certain "working fluids" which are used in refrigeration and other cooling processes. Certain organic liquids, such as dichloro-diflouoromethane, have been associated with the destruction of the ozone layer and the attendant warming of the earth by the "greenhouse effect". Because of the potential dangers associated with the use of these "working fluids", alternative cooling processes have been developed.

An alternative cooling process which has recently gained favor involves the use of thermoelectric devices which function as a heat pump by the Peltier principle. These thermoelectric devices comprise a circuit of an N-type semiconductor and a P-type semiconductor joined electrically at one end to form a couple. These couples are joined together electrically in series to form a multicouple device that serves as a solid state heat pump.

However, several problems are associated with the use of thermoelectric heat pumping devices. The efficiency of conventional thermoelectric heat pumping devices tend to be fairly low and a figure-of-merit (Z) of approximately $2.3-2.5 \times 10^{-3}/°K$. are typical. The figure-of-merit (Z) is defined as $\alpha^2 \sigma / K$, wherein $\alpha$=Seebeck coefficient=$\mu V/°K$.; $\sigma$=electrical conductivity=$(\Omega cm)^{-1}$; and K=thermal conductivity=$mW/cm\ °K$.

Another problem associated with conventional thermoelectric heat pumping devices is their fragility, i.e., low compressive, shear and tensile strengths. Conventional thermoelectric modules comprise crystalline grown, sliced and diced semiconductor elements which contain classic cleavage planes which are held together by weak Vander Waal bonds. Accordingly, they are subject to failure in applications involving vibration, temperature cycling, shock and high thermal stress. Therefore, in order to expand the range of utilization of these thermoelectric cooling devices, there is a need for semiconductor elements having a higher thermal efficiency and improved mechanical properties.

SUMMARY OF THE INVENTION

An object of the present invention is to provide a thermoelectric device having an improved figure-of-merit when compared with conventional thermoelectric devices.

Another object of the present invention is to provide a thermoelectric device having improved mechanical properties when compared with conventional thermoelectric devices.

A further object of the present invention is to provide a method for producing the above-discussed thermoelectric device having an improved figure-of-merit and superior mechanical properties.

A still further object of the present invention is to provide a heat pump comprising the above-described thermoelectric device.

These and other objects are attained by providing a thermoelectric device made up of a pressed and sintered P-type semiconductor electrically joined to a conventional crystalline N-type semiconductor. The P-type semiconductor material can be either cold-pressed or hot-pressed prior to sintering. The thermoelectric element of the present invention lends itself to be mass produced in an inexpensive manner.

BRIEF DESCRIPTION OF THE DRAWING

The FIGURE illustrates heat pump which incorporates a semiconductor couple of the present invention.

DESCRIPTION OF THE PREFERRED EMBODIMENT

Although almost any conventionally available N-type and P-type semiconductor material can be used in the present invention, the preferred N-type semiconductor material is of the bismuth-telluride family and the preferred P-type semiconductor material is formulated from bismuth, antimony and tellurium. An especially preferred N-type composition is $(Bi_2Te_3)_{90}(Sb_2Te_3)_5(Sb_2Se_3)_5$ doped with iodine compounded with either of bismuth or antimony. Iodine can be present as the dopant in an amount of up to 0.08 atomic percent. Other halogenous dopants such as CuBr, AgI and CuI can also be used in the N-type semiconductor material. An especially preferred P-type material is of the formula $Bi_aSb_bTe_c$, wherein $10 \leq a \leq 15$, $20 \leq b \leq 25$ and $60 \leq c \leq 65$ in atomic percents.

The crystalline N-type semiconductor material can be produced by conventional techniques such as the Stockbarger or Bridgman methods, which are well known to those of ordinary skill in the art, with the Stockbarger method being preferred. In the Stockbarger method, a sealed silica tube containing a melt of the N-type semiconductor material is lowered vertically through a freezing gradient in a furnace which typically has an upper portion maintained at a temperature of about 50° C. above the melting point of the semiconductor material and a lower portion at a temperature of about 50° C. lower than the melting point of the semiconductor material. The silica tube typically has a pear-shaped or conical pointed bottom which enters the freezing zone first and thereby encourages crystal growth to occur at a single site. The rate of lowering the silica tube is typically in the range of 0.1 to 10 cm/hr with the slower rates generally producing better crystals.

The P-type semiconductor crystals can be formed by conventional methods, such as the Stockbarger or Bridgman methods, with the Bridgman method being especially preferred. In the Bridgman method, the silica tube is lowered through the natural temperature gradient of a single furnace. Since crystal perfection is not of primary importance in the manufacture of the P-type crystalline material, the Bridgman method is preferably used to obtain the crystalline P-type material of the present invention. The formed P-type crystalline material is removed, ground to a powder in a rotary mill to a particle size between 70 and 400 mesh and pressed in a conventional powder compacting press. The pressing step can be accomplished by either hot pressing or cold pressing, with cold pressing being preferred from an energy standpoint. The conditions for the hot or cold pressing steps are not critical and can be carried out under the conditions customarily used in the prior art. The cold pressing is preferably carried out at room temperature and a pressure between 150,000–225,000 psia. At this pressure, the cold pressing step is accomplished almost instantaneously. The hot pressing is preferably carried out at a pressure of approximately 50,000 psia and a temperature of about 385° C. for about 1–72 hours to form the molded P-type material. The formed P-type material is then sintered at 385° to 550° C. for 6–72 hours in a vacuum or inert atmosphere to obtain the desired pressed and sintered P-type semiconductor material, which is preferably at least 95% of the theoretical density.

The crystalline N-type material and the pressed and sintered P-type material are chosen such that their properties are compatible. That is, the physical properties of one semiconductor material does not limit the physical properties of the other semiconductor material when they are formed into a semiconductor couple. The electrical conductivity of the P-type and the N-type material of the present invention is typically very high, in the range of 1000 ohms$^{-1}$cm$^{-1}$.

The pressed and sintered P-type and crystalline N-type pellets are then formed into an array of semiconductor couples connected electrically in series and thermally in parallel by being sandwiched between metallized substrates. By connecting a thermoelectric module to a DC power source, heat will be absorbed at one end of the device, thereby cooling it while heat is rejected at the device's other end.

A heat pump incorporating a semiconductor couple of the present invention is illustrated in the Figure. The heat pump 10 comprises an upper ceramic substrate 11 and a lower ceramic substrate 12. The upper surface of the upper ceramic substrate 11 is placed in contact with the surface of the object to be cooled and the lower surface of the lower ceramic substrate 12 is contacted with a heat sink to dissipate the absorbed heat. A N-type semiconductor 15 and a P-type semiconductor 16 are provided between the upper ceramic substrate 11 and the lower ceramic substrate 12. A first electrically conductive layer 17 is provided on the underside of the upper ceramic substrate 11 and contacted by upper ends of the N-type semiconductor 15 and P-type semiconductor 16. A second electrically conductive layer 20 is provided on a portion of the upper surface of the lower ceramic substrate and in contact with the lower end of the N-type semiconductor 15. A third electrically conductive layer 21 is provided on another portion of the upper surface of the lower ceramic substrate 12 and in contact with the lower end of the P-type semiconductor 16. A direct current source 22 is provided with a positive terminal electrically connected with the second electrically conductive layer 20 and a negative terminal electrically connected with the third electrically conductive layer 21.

In operation, heat is absorbed at the first ceramic substrate 11 and rejected at the second ceramic substrate 12 by the Peltier Effect when the second conductive layer 20 and the third conductive layer 21 are connected to the DC source 22 in the manner illustrated in the Figure. The direction of heat flow in the heat pump 10 is reversed by reversing the current flow to the second and third conductive layers.

EXAMPLE

A semiconductor couple of the present invention was formed by electrically connecting a crystalline N-type semiconductor pellet in series with a pressed and sintered P-type semiconductor pellet in the manner illustrated in the Figure. The N-type semiconductor pellet had a composition of $(Bi_2Te_3)_{90}(Sb_2Te_3)_5(Sb_2Se_3)_5$ and was doped with 0.05 atomic percent iodine compounded with bismuth. The P-type semiconductor pellet was of the composition $Bi_{12}Sb_{23}Te_{65}$. The properties of the semiconductor couple of the present invention are shown below in the Table where they are compared with conventional crystalline semiconductor couples and conventional pressed and sintered semiconductor couples.

TABLE

|  | Seebeck | Sigma | Kappa | Z |
|---|---|---|---|---|
| Invention Example | 190.9 | 1014.4 | 13.407 | 2.758 |
| Conventional P&S | 202.3 | 828.3 | 14.115 | 2.402 |
| Conventional Crystalline | 197.0 | 887.2 | 14.341 | 2.401 |

Definitions:
Seebeck coefficient = $\alpha$ = $\mu V/°K$ = EMF developed when a differential of temperature exists; top/bottom module.
Sigma = $\sigma$ = $(\Omega cm)^{-1}$ = Electrical conductivity of material.
Kappa = K = mW/cm·°K. = Thermal conductivity of material.
Z = × $10^3$/°K. = $\alpha^2\sigma/K$ = Figure-of-merit.

As can be seen from the above Table, the semiconductor couples of the present invention clearly have an unexpectedly high Figure-of-merit when compared with conventional semiconductor couples.

What is claimed is:

1. A thermoelectric element comprising a pressed and sintered P-type semiconductor material connected to a crystalline N-type semiconductor material.

2. The thermoelectric element of claim 1, wherein said P-type semiconductor material is a Bi-Sb-Te composition.

3. The thermoelectric element of claim 1, wherein said N-type semiconductor material is a Bi-Sb-Te-Se composition doped with I compounded with Bi.

4. The thermoelectric element of claim 1, wherein said N-type semiconductor material is a Bi-Sb-Te-Se composition doped with I compounded with Sb.

5. The thermoelectric element of claim 2, wherein said P-type semiconductor material has the formula $Bi_aSb_bTe_c$, wherein $10 \leq a \leq 15$, $20 \leq b \leq 25$ and $60 \leq c \leq 65$ in atomic percents.

6. The thermoelectric element of claim 3, wherein said Bi-Sb-Te-Se composition has the formula $(Bi_2Te_3)_{90}(Sb_2Te_3)_5(Sb_2Se_3)_5$.

7. The thermoelectric element of claim 4, wherein said Bi-Sb-Te-Se composition has the formula $(Bi_2Te_3)_{90}(Sb_2Te_3)_5(Sb_2Se_3)_5$.

8. A heat pump comprising a thermoelectric element having a pressed and sintered P-type semiconductor material connected to a crystalline N-type semiconductor material.

9. The heat pump of claim 8, wherein said crystalline N-type semiconductor and pressed and sintered P-type semiconductor material is contained between metallized substrates.

* * * * *

REEXAMINATION CERTIFICATE (3346th)
United States Patent [19]
Cauchy

[11] B1 5,448,109
[45] Certificate Issued Oct. 7, 1997

[54] THERMOELECTRIC MODULE

[75] Inventor: Charles J. Cauchy, Traverse City, Mich.

[73] Assignee: Tellurex Corporation, Traverse City, Mich.

Reexamination Request:
No. 90/004,285, Jun. 20, 1996

Reexamination Certificate for:
Patent No.: 5,448,109
Issued: Sep. 5, 1995
Appl. No.: 207,838
Filed: Mar. 8, 1994

[51] Int. Cl.$^6$ ............................ H01L 23/58; H01L 35/28
[52] U.S. Cl. ............................ 257/719; 257/64
[58] Field of Search ............................ 257/712, 719, 257/718, 726, 64, 467–469

[56] References Cited

U.S. PATENT DOCUMENTS 4,855,810  8/1989  Gelb et al. ............................ 257/712

OTHER PUBLICATIONS

*Development of a Two–Ton Thermoelectric Environmental Control Unit for the U.S. Army* by J.C. Purcupile, et al. (Copyright 1968).
*Thermoelectric Properties of Fine Grained* by Amin, Al–Ghaffari, Issa and Hassib, 1992, pp. 1250–1254.
*Tellurium*, by W. Charles Cooper, 1971, pp. 344–346.
*Fourth International Conference on Thermoelectric Energy Conversion*, The University of Texas at Arlington, Mar. 10–12, 1982, pp. 157–159.
*Gilson Catalog 93–1*, p. G–47.
Champness, C.H., et al., "Thermoelectric Properties of $Bi_2Te_3$–$Sb_2Te_3$ Alloys," *Canadian Journal of Physics*, vol. 43 (1965), pp. 653–669.
T. Durst, et al., "Production of Alloys of Bismuth Telluride for Solar Thermoelectric Generators", *Solar Energy Materials*, vol. 5 (1981) pp. 181–186.

Primary Examiner—Wael Fahmy

[57] ABSTRACT

A thermoelectric device using a pressed and sintered P-type semiconductor material connected to a crystalline N-type semiconductor material exhibits an unexpectedly high figure-of-merit, Z, and improved mechanical strength.

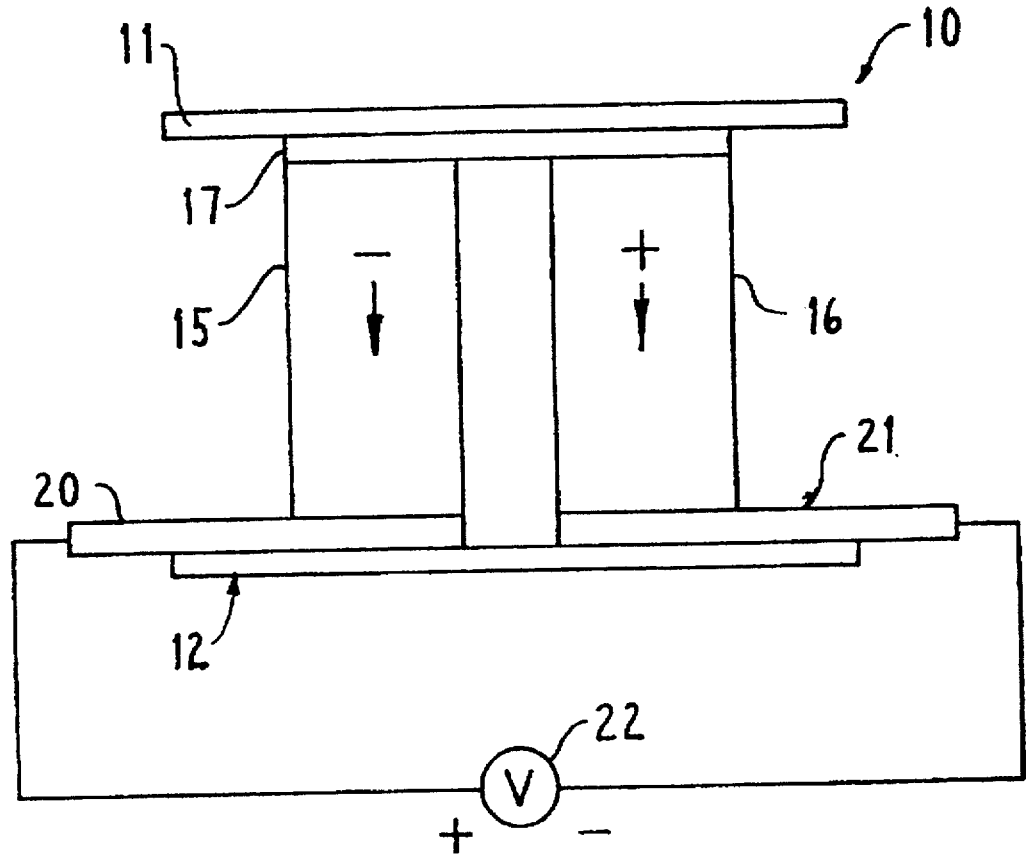

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 8 are determined to be patentable as amended.

Claims 2–7 and 9, dependent on an amended claim, are determined to be patentable.

New claims 10–30 are added and determined to be patentable.

1. A thermoelectric element comprising a pressed and sintered P-type semiconductor material connected to a crystalline N-type semiconductor material, *wherein said P-type semiconductor material and said N-type semiconductor material have substantially the same electrical conductivity*.

8. A heat pump comprising a thermoelectric element [having] *including* a first pellet comprising a pressed and sintered P-type semiconductor material [connected to], *a second pellet comprising* a crystalline N-type semiconductor material, *and an electrode connecting said first pellet and said second pellet to form a thermoelectric element with said first pellet and said second pellet connected electrically in series, wherein said P-type semiconductor material and said N-type semiconductor material have substantially the same electrical conductivity*.

*10. The thermoelectric element of claim 1, wherein said electrical conductivity of said P-type semiconductor material and said N-type semiconductor material is in the range of 1000 $ohms^{-1}cm^{-1}$.*

*11. The thermoelectric element of claim 10, wherein said N-type semiconductor material comprises a pellet electrically connected in series to a pellet of said P-type semiconductor material by a pair of electrodes, each comprising a conductive layer on a substrate.*

*12. The thermoelectric element of claim 5, wherein in said formula $Bi_aSb_bTe_c$, a=12, b=23 and c=65.*

*13. A thermoelectric element comprising a pressed and sintered P-type semiconductor material connected to a crystalline N-type semiconductor material, wherein said P-type semiconductor material has the formula $Bi_aSb_bTe_c$ wherein $10 \leq a \leq 15$, $20 \leq b \leq 25$ and $60 \leq c \leq 65$ in atomic percents.*

*14. A thermoelectric element comprising a pressed and sintered P-type semiconductor material connected to a crystalline N-type semiconductor material, said P-type semiconductor material having the formula $Bi_aSb_bTe_c$ wherein $10 \leq a \leq 15$, $20 \leq b \leq 25$ and $60 \leq c \leq 65$ in atomic percents, and said P-type semiconductor element and said N-type semiconductor element having substantially the same electrical conductivity.*

*15. The thermoelectric element of claim 14, wherein said N-type semiconductor material is a Bi-Sb-Te-Se composition doped with I compounded with another element selected from the group consisting of Bi and Sb.*

*16. The thermoelectric element of claim 15, wherein said Bi-Sb-Te-Se composition has the formula $(Bi_2Te_3)_{90}(Sb_2Te_3)_5(Sb_2Se_3)_5$.*

*17. The thermoelectric element of claim 13, wherein in said formula $Bi_aSb_bTe_c$, a=12, b=23 and c=65.*

*18. A thermoelectric element comprising:*

*a pellet of a crystalline N-type semiconductor material; and*

*a pellet of a pressed and sintered P-type semiconductor material connected to said pellet of a crystalline N-type semiconductor material, said pellet of a P-type semiconductor material being made by grinding a P-type semiconductor crystal in a rotary mill to a powder with a particle size of between 70 and 400 mesh, and then cold pressing said powder at a pressure between 150,000–225,000 psia.*

*19. The thermoelectric element of claim 18, wherein said P-type semiconductor material has the formula $Bi_aSb_bTe_c$, wherein $10 \leq a \leq 15$, $20 \leq b \leq 25$ and $60 \leq c \leq 65$ in atomic percents.*

*20. A thermoelectric element comprising:*

*a pellet of a crystalline N-type semiconductor material; and*

*a pellet of a pressed and sintered P-type semiconductor material connected to said pellet of a crystalline N-type semiconductor material, said pellet of a P-type semiconductor material being made by grinding a P-type semiconductor crystal in a rotary mill to a powder with a particle size of between 70 and 400 mesh, and then cold pressing said powder at a pressure between 150,000–225,000 psia, said P-type semiconductor material having the formula $Bi_aSb_bTe_c$ wherein $10 \leq a \leq 15$, $20 \leq b \leq 25$ and $60 \leq c \leq 65$ in atomic percents, and said P-type semiconductor element and said N-type semiconductor element having substantially the same electrical conductivity.*

*21. The thermoelectric element of claim 20, wherein said electrical conductivity of said P-type semiconductor material and said N-type semiconductor material is in the range of 1000 $ohms^{-1}cm^{-1}$.*

*22. The thermoelectric element of claim 19, wherein said N-type semiconductor material is a Bi-Sb-Te-Se composition doped with I compounded with another element selected from the group consisting of Bi and Sb.*

*23. The thermoelectric element of claim 22, wherein said Bi-Sb-Te-Se composition has the formula $(Bi_2Te_3)_{90}(Sb_2Te_3)_5(Sb_2Se_3)_5$.*

*24. The thermoelectric element of claim 19, wherein in said formula $Bi_aSb_bTe_c$, a=12, b=23 and c=65.*

*25. A heat pump comprising:*

*a first ceramic substrate having a metallized surface;*

*a second ceramic substrate having a metallized surface, said second ceramic substrate being spaced from said first ceramic substrate with said metallized surface of said first substrate in facing relation with said metallized surface of said second substrate;*

*a plurality of first pellets of a pressed and sintered P-type semiconductor material having an electrical conductivity in the range of 1000 $ohms^{-1}cm^{-1}$ disposed between said first substrate and said second substrate; and*

*a plurality of second pellets of a crystalline N-type semiconductor material having an electrical conductivity in the range of 1000 $ohms^{-1}cm^{-1}$ disposed between said first substrate and said second substrate;* each of said first pellets and said second pellets having one end electrically connected to one said metallized surface and another end electrically connected to said facing metallized surface to form an array of semiconductor couples connected electrically in series and thermally in parallel whereby said substrates exhibit a temperature difference therebetween when electric current is passed through said series connection of said semiconductor couples.

26. The heat pump of claim 25, wherein said first pellets of a pressed and sintered P-type semiconductor material are made by grinding a P-type semiconductor crystal in a rotary mill to a powder with a particle size of between 70 and 400 mesh, and then cold pressing said powder at a pressure between 150,000–225,000 psia.

27. The heat pump of claim 26, wherein said P-type semiconductor material has the formula $Bi_aSb_bTe_c$, wherein $10 \leq a \leq 15$, $20 \leq b \leq 25$ and $60 \leq c \leq 65$ in atomic percents.

28. The heat pump of claim 27, wherein said N-type semiconductor material is a Bi-Sb-Te-Se composition doped with I compounded with another element selected from the group consisting of Bi and Sb.

29. The heat pump of claim 28, wherein said Bi-Sb-Te-Se composition has the formula $(Bi_2Te_3)_{90}(Sb_2Te_3)_5(Sb_2Se_3)_5$.

30. The heat pump of claim 29, wherein in said formula $Bi_aSb_bTe_c$, $a=12$, $b=23$ and $c=65$.

* * * * *